(12) United States Patent
Chen et al.

(10) Patent No.: US 10,515,949 B2
(45) Date of Patent: Dec. 24, 2019

(54) INTEGRATED CIRCUIT AND MANUFACTURING METHOD THEREOF

(71) Applicant: TAIWAN SEMICONDUCTOR MANUFACTURING CO., LTD., Hsinchu (TW)

(72) Inventors: Shao-Yu Chen, Tainan (TW); Chih-Ping Chao, Hsinchu (TW); Chun-Hung Chen, Hsinchu County (TW); Chung-Long Chang, Yun Lin (TW); Kuan-Chi Tsai, Kaohsiung (TW); Wei-Kung Tsai, Tainan (TW); Hsiang-Chi Chen, Taichung (TW); Ching-Chung Hsu, Taichung (TW); Cheng-Chang Hsu, Hsinchu County (TW); Yi-Sin Wang, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 30 days.

(21) Appl. No.: 14/056,725

(22) Filed: Oct. 17, 2013

(65) Prior Publication Data
US 2015/0108607 A1 Apr. 23, 2015

(51) Int. Cl.
*H01L 27/07* (2006.01)
*H01L 49/02* (2006.01)

(52) U.S. Cl.
CPC .......... *H01L 27/0794* (2013.01); *H01L 28/60* (2013.01)

(58) Field of Classification Search
CPC ............. H01L 27/0794; H01L 29/7408; H01L 23/5223; H01L 23/5228; H01L 28/24; H01L 28/60; H01L 27/0788; H01L 27/0805; H01L 28/40
USPC ........................................................ 257/516
See application file for complete search history.

(56) References Cited

U.S. PATENT DOCUMENTS

| | | | | |
|---|---|---|---|---|
| 6,680,521 B1* | 1/2004 | Kar-Roy | ............. | H01L 27/0805 257/532 |
| 6,709,918 B1* | 3/2004 | Ng | ....................... | H01L 23/5223 257/E21.004 |
| 6,730,573 B1* | 5/2004 | Ng | ....................... | H01L 23/5223 257/E21.006 |
| 7,623,338 B2* | 11/2009 | Won | ........................ | H01G 4/385 361/303 |
| 8,445,353 B1* | 5/2013 | Raghavan | ........... | H01L 23/5223 257/E27.025 |

(Continued)

OTHER PUBLICATIONS

Integrated Passive Devices http://www.onsemi.con/PowerSolutions/content.do?id=16699 Downloaded Oct. 16, 2013.

*Primary Examiner* — Bilkis Jahan
(74) *Attorney, Agent, or Firm* — McDermott Will & Emery LLP

(57) ABSTRACT

An integrated circuit includes a stacked MIM capacitor and a thin film resistor and methods of fabricating the same are disclosed. A capacitor bottom metal in one capacitor of the stacked MIM capacitor and the thin film resistor are substantially at the same layer of the integrated circuit, and the capacitor bottom metal and the thin film resistor are also made of substantially the same materials. The integrated circuit with both of a stacked MIM capacitor and a thin film resistor can be made in a cost benefit way accordingly, so as to overcome disadvantages mentioned above.

20 Claims, 16 Drawing Sheets

(56) References Cited

U.S. PATENT DOCUMENTS

| | | | | |
|---|---|---|---|---|
| 2002/0192919 A1* | 12/2002 | Bothra | ............... | H01L 28/40 |
| | | | | 438/381 |
| 2004/0072406 A1* | 4/2004 | Ng | ............... | H01L 27/0682 |
| | | | | 438/396 |
| 2005/0012223 A1* | 1/2005 | Koller | ............... | H01L 28/55 |
| | | | | 257/774 |
| 2005/0029566 A1* | 2/2005 | Chen | ............... | H01L 23/5223 |
| | | | | 257/296 |
| 2005/0062130 A1* | 3/2005 | Ciancio | ............... | H01L 23/5223 |
| | | | | 257/532 |
| 2006/0001070 A1* | 1/2006 | Park | ............... | H01L 27/11502 |
| | | | | 257/309 |
| 2007/0132049 A1* | 6/2007 | Stipe | ............... | G11C 13/0007 |
| | | | | 257/421 |
| 2008/0001256 A1* | 1/2008 | Remmel | ............... | H01L 23/5223 |
| | | | | 257/533 |
| 2013/0081240 A1* | 4/2013 | Dunn | ............... | H01G 4/1209 |
| | | | | 29/25.42 |

* cited by examiner

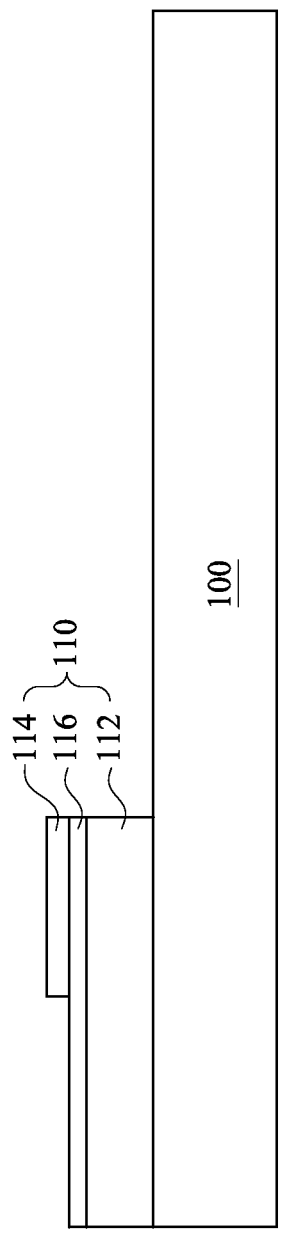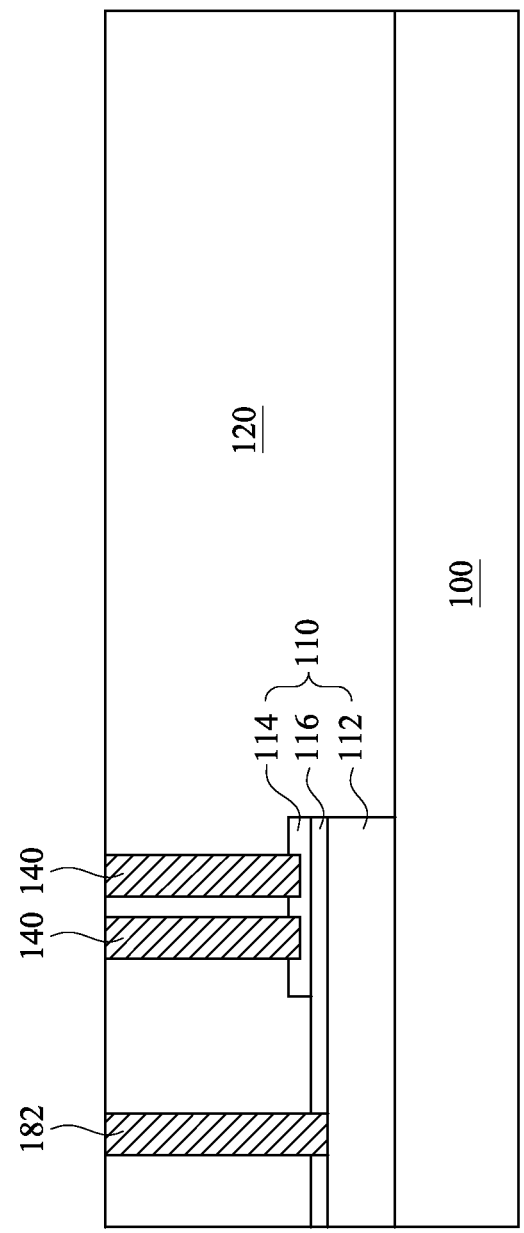

INTEGRATED CIRCUIT AND MANUFACTURING METHOD THEREOF

BACKGROUND

For the past several decades, the scaling of features in integrated circuits has been a driving force behind an ever-growing semiconductor industry. Scaling to smaller features enables increased densities of functional units on the limited real estate of semiconductor chips. As semiconductor devices have become highly integrated, a MIM capacitor having a higher capacitance per unit of chip area is required. The MIM capacitor is widely used for applications such as an analog to digital (AD) converter, a RF device, a switching capacitor filter, and a CMOS image sensor (CIS). To meet the requirements of high integration, an integrated circuit of a semiconductor device has been proposed with a stacked MIM capacitor, which has a high capacitance per unit of chip area.

In integrated circuit of the semiconductor device, thin film resistors (TFRs) are attractive components for high precision analog and mixed signal applications, and have been utilized in electronic circuits of many important technological applications. Special cares are required as integrating the TFRs into existing process flows of an integrated circuit. Generally, in fabricating a TFR in an integrated circuit, materials of the TFR are evaporated or sputtered onto a substrate and subsequently patterned and etched. As such, the TFR is embedded between the inter-metal dielectric (IMD) layers. The TFR needs an electrical connection. Therefore, two extra mask layers are required to form the TFR itself and to form the contact points of the TFR.

As the semiconductor devices being required to perform multiple functions and become highly integrated, the stacked MIM capacitor and the TFR are often integrated in one integrated circuit of the semiconductor devices. However, as aforementioned, two extra mask layers are required in fabricating the TFR in the integrated circuit. Therefore, the cost of fabrication of an integrated circuit with both of the stacked MIM capacitor and the TFR is increased by additional masks for the TFR. Besides, process margin and the reliability of the integrated circuit produced are also limited by multiple deposition and dry/wet etch steps which are required to incorporate the TFR into the integrated circuit. Accordingly, improvements in structures and methods of forming the integrated circuit with both of the stacked MIM capacitor and the TFR continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8 is schematic views of the integrated circuit shown in FIG. 7 in a subsequent stage of manufacture according to various embodiments of the present disclosure.

FIG. 9 is a schematic view of the integrated circuit shown in FIG. 8 in a subsequent stage of manufacture according to various embodiments of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a", "an" and "the" used herein include plural referents unless the context clearly dictates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally, it needs two extra masks and corresponding Litho/Etch processes in fabricating a TFR into an integrated circuit with a stack MIM capacitor. Therefore, the cost of fabrication of an integrated circuit with both of the stacked MIM capacitor and the TFR is increased, and process margin and the reliability of the integrated circuit produced are also limited. In this regard, an integrated circuit and a method of manufacturing the integrated circuit are provided according to various embodiments of the present disclosure.

Figure 1:
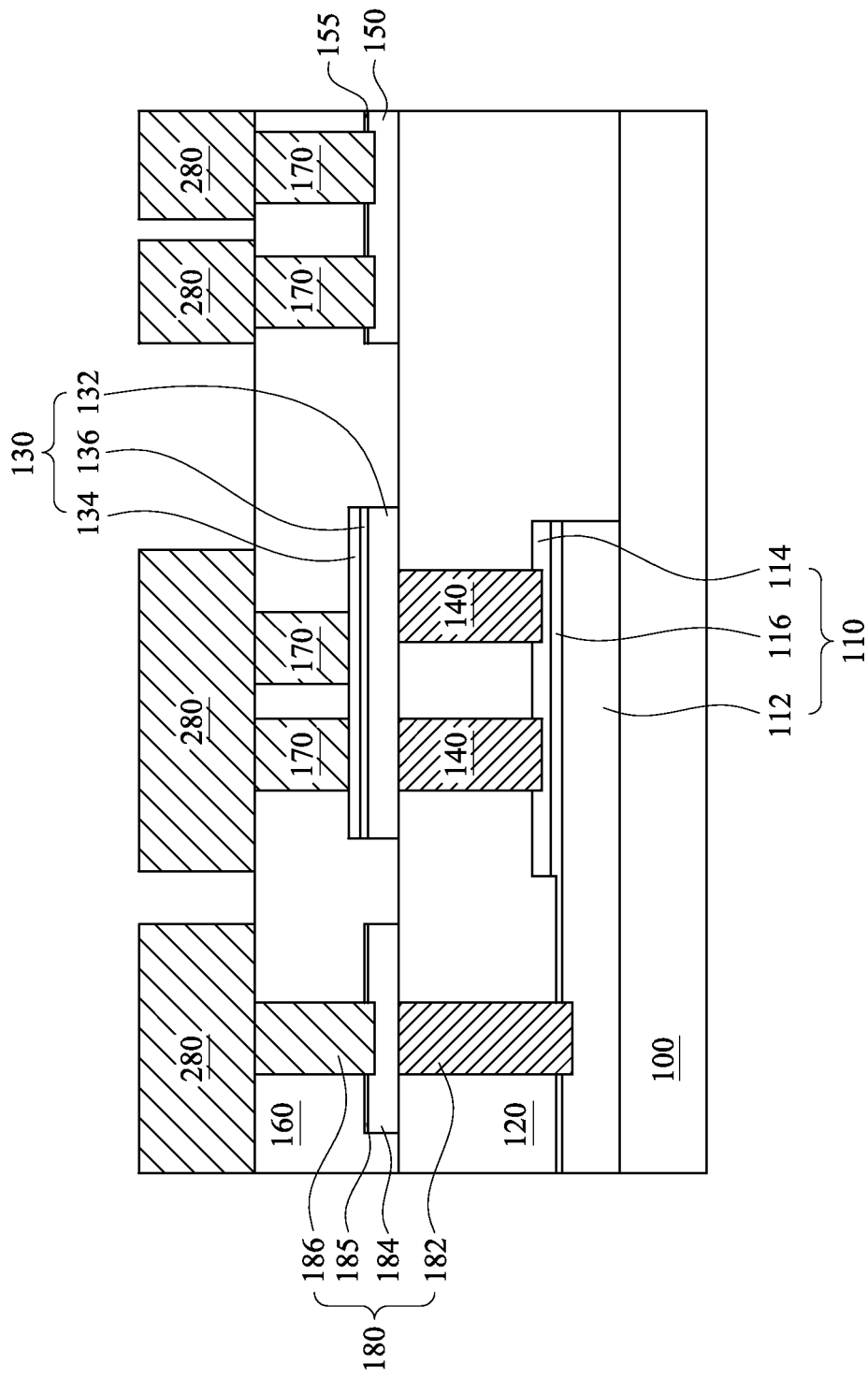
FIG. 1 is a schematic view of at least a portion of an integrated circuit according to various embodiments of the present disclosure.

FIG. 1 is a schematic view of at least a portion of an integrated circuit according to various embodiments of the present disclosure. The integrated circuit includes a first capacitor 110, a first dielectric layer 120, a second capacitor 130, at least one first via 140, a thin film resistor 150, a second dielectric layer 160, and a plurality of second vias 170. The first capacitor 110 has a capacitor bottom metal 112, a capacitor top metal 114, and an inter-electrode dielectric layer 116. As illustrated in FIG. 1, in various embodiments of the present disclosure, the inter-electrode dielectric layer 116 of the first capacitor 110 is sandwiched by the capacitor bottom metal 112 and the capacitor top metal 114 of the first capacitor 110 to form a metal-insulator-metal (MIM) capacitor. The capacitor top metal 114 of the first capacitor 110 may be made of, for example, tantalum nitride (TaN), titanium nitride (TiN), aluminium-copper alloy (AlCu), or the combination thereof. In various embodiments of the present disclosure, the capacitor bottom metal 112 of the first capacitor 110 is a film lamination consisting of two titanium nitride (TiN) films, and an aluminium-copper alloy (AlCu) film which is sandwiched by the two TiN films. The inter-electrode dielectric layers of the first capacitor and the second capacitor are multi-layers structures consisting of a silicon oxide (SiO$_2$) film, a silicon nitride (Si$_x$N$_y$) film, a hafnium oxide (HfO$_2$) film, a zirconium oxide (ZrO$_2$) film, or an aluminum oxide (Al$_2$O$_3$) film. In various embodiments of the present disclosure, the area of the capacitor bottom metal 112 of the first capacitor 110 is larger than that of the capacitor top metal 114 of the first capacitor 110 for forming the electrical connection of the capacitor bottom metal 112 conveniently.

As illustrated in FIG. 1, the first dielectric layer 120 covers the first capacitor 110. The first dielectric layer 120 may be formed of silicon oxide (SiO$_2$), silicon nitride (Si$_x$N$_y$), or the combination thereof. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, inter-level dielectric materials such as undoped silica glass (USG), phosphor doped silicate glass (PSG), fluorine doped silicate glass (FSG), a boron doped silicate glass (BSG) layer, or a boron phosphorous-doped silicate glass (BPSG) layer may be used.

Referring to FIG. 1, the second capacitor 130 is disposed on the first dielectric layer 120, and the second capacitor 130 also has a capacitor bottom metal 132, a capacitor top metal 134, and an inter-electrode dielectric layer 136. In various embodiments of the present disclosure, the inter-electrode dielectric layer 136 of the second capacitor 130 is sandwiched by the capacitor bottom metal 132 and the capacitor top metal 134 of the second capacitor 130 to form a metal-insulator-metal (MIM) capacitor. The capacitor top metal 134 of the second capacitor 130 is made of tantalum nitride (TaN), titanium nitride (TiN), aluminium-copper alloy (AlCu), or the combination thereof. At least one first via 140 is disposed in the first dielectric layer 120, and electrically connected to the capacitor top metal 114 of the first capacitor 110 and the capacitor bottom metal 132 of the second capacitor 130. The first via 140 is made of conductive materials to offer an electrical connection between the first capacitor 110 and the second capacitor 130 which are disposed in different levels. In various embodiments of the present disclosure, the first via 140 is made of copper. Accordingly, two metal-insulator-metal (MIM) capacitors, the first capacitor 110 and the second capacitor 130 are electrically connected in series through the first via 140, and can be regarded as a stacked metal-insulator-metal (MIM) capacitor. Therefore, the density of capacitors in the integrated circuit is increased without requiring an excessive amount of surface area of the semiconductor substrate 100.

As illustrated in FIG. 1, the thin film resistor 150 is disposed on the first dielectric layer 120. It should be noticed that the thin film resistor 150 and the capacitor bottom metal 132 of the second capacitor 130 are substantially at the same layer, which is disposed on the first dielectric layer 120. In addition, the material of the capacitor bottom metal 132 of the second capacitor 130 is substantially the same as the material of the thin film resistor 150. Accordingly, the thin film resistor 150 and the capacitor bottom metal 132 of the second capacitor 130 can be fabricated in the same step. In other words, the fabrication of the thin film resistor 150 can be integrated into the fabrication of the capacitor bottom metal 132 of the second capacitor 130, and therefore the cost of fabricating an integrated circuit with both of a stacked MIM capacitor and a thin film resistor is reduced. In various embodiments of the present disclosure, the capacitor bottom metal 132 of the second capacitor 130 and the thin film resistor 150 are made of tantalum nitride (TaN), titanium nitride (TiN), silicon-chrome (SiCr), tantalum, or the combination thereof.

As shown in FIG. 1, the second dielectric layer 160 is disposed on the first dielectric layer 120 and covering the second capacitor 130 and the thin film resistor 150. The second dielectric layer 160 may be formed of silicon oxide (SiO$_2$), silicon nitride (Si$_x$N$_y$), or the combination thereof. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, inter-level dielectric materials such as undoped silica glass (USG), phosphor doped silicate glass (PSG), fluorine doped silicate glass (FSG), a boron doped silicate glass (BSG) layer, or a boron phosphorous-doped silicate glass (BPSG) layer may be used. As illustrated in FIG. 1, the plurality of second vias 170 is disposed in the second dielectric layer 160, and respectively connected to the capacitor top metal 134 of the second capacitor 130 and the thin film resistor 150. The plurality of second vias 170 is made of conductive materials to offer an electrical connection between different levels. In various embodiments of the present disclosure, the plurality of second vias 170 is made of aluminum-copper alloy (AlCu). As shown in FIG. 1, some second vias 170 are electrically connected to the capacitor top metal 134 of the second capacitor 130; other second vias 170 are electrically connected to the thin film resistor 150. The plurality of second vias 170 offers respective electrical connecting paths of the capacitor top metal 134 of the second capacitor 130 and the thin film resistor 150. The second vias 170, which are electrically connected to the capacitor top metal 134 of the second capacitor 130, offer an electrical connecting path for the capacitor top metal 134 of the second capacitor 130; Other second vias 170, which are electrically connected to the thin film resistor 150, offer an electrical connecting path for the thin film resistor 150. Therefore, the electrically conductive path of the thin film resistor 150 is established. For example, a signal current may flow in through the second via 170 on one side of the thin film resistor 150, then flow to the thin film resistor 150, and finally flow out through the second via 170 on another side of the thin film resistor 150.

Also shown in FIG. 1, in various embodiments of the present disclosure, the integrated circuit further includes at least one third via 180 is disposed in the first dielectric layer 120 and the second dielectric layer 160, and electrically connected to the capacitor bottom metal 112 of the first capacitor 110. The third via 180 is made of conductive materials to offer an electrical connection from the capacitor bottom metal 112 of the first capacitor 110 to a higher level. In various embodiments of the present disclosure, the third via 180 includes an eighth via 182, an interlayer connection 184, and a ninth via 186. The eighth via 182 is disposed in the first dielectric layer 120 and connected to the capacitor bottom metal 112 of the first capacitor 110. The interlayer connection 184 is disposed on the first dielectric layer 120 and connected to the eighth via 182. The ninth via 186 is disposed in the second layer 160 and connected to the interlayer connection 184. Therefore, the electrically conductive path of the stacked metal-insulator-metal (MIM) capacitor, which includes the first capacitor 110 and the second capacitor 130, is established. For example, a signal current may flow in through the second via 170, the second capacitor 130, the first via 140, the first capacitor 110, the eighth via 182, the interlayer connection 184, and flow out through the ninth via 186.

Also illustrated in FIG. 1, in various embodiments of the present disclosure, the integrated circuit further includes a plurality of bonding pads 280 disposed on the second dielectric layer 160. Wherein at least one of the plurality of bonding pads 280 is electrically connected to the capacitor bottom metal 112 of the first capacitor 110, at least another one of the plurality of bonding pads 280 is electrically connected to the capacitor top metal 134 of the second capacitor 130, and at least another two of the plurality of bonding pads 280 are electrically connected to the thin film resistor 150. The plurality of bonding pads 280 is made of conductive materials such as metals and metal alloys. As shown in FIG. 1, one bonding pad 280 connected to the third via 180 is electrically connected to the capacitor bottom metal 112 of the first capacitor 110, another one bonding pad 280 connected to the second vias 170 is electrically connected to the capacitor top metal 134 of the second capacitor 130. These two bonding pads 280 can be respectively regarded as an input or an output of the stacked metal-insulator-metal (MIM) capacitor, which includes the first capacitor 110 and the second capacitor 130. Besides, another two bonding pads 280 connected to the second vias 170 are electrically connected to the thin film resistor 150. These two bonding pads 280 can be respectively regarded as an input or an output of the thin film resistor 150. All of the plurality of bonding pads 280 may be further formed a bonding wire, a metal clip or a bump to electrically connect to a circuit board or other semiconductor chips.

Figure 2:
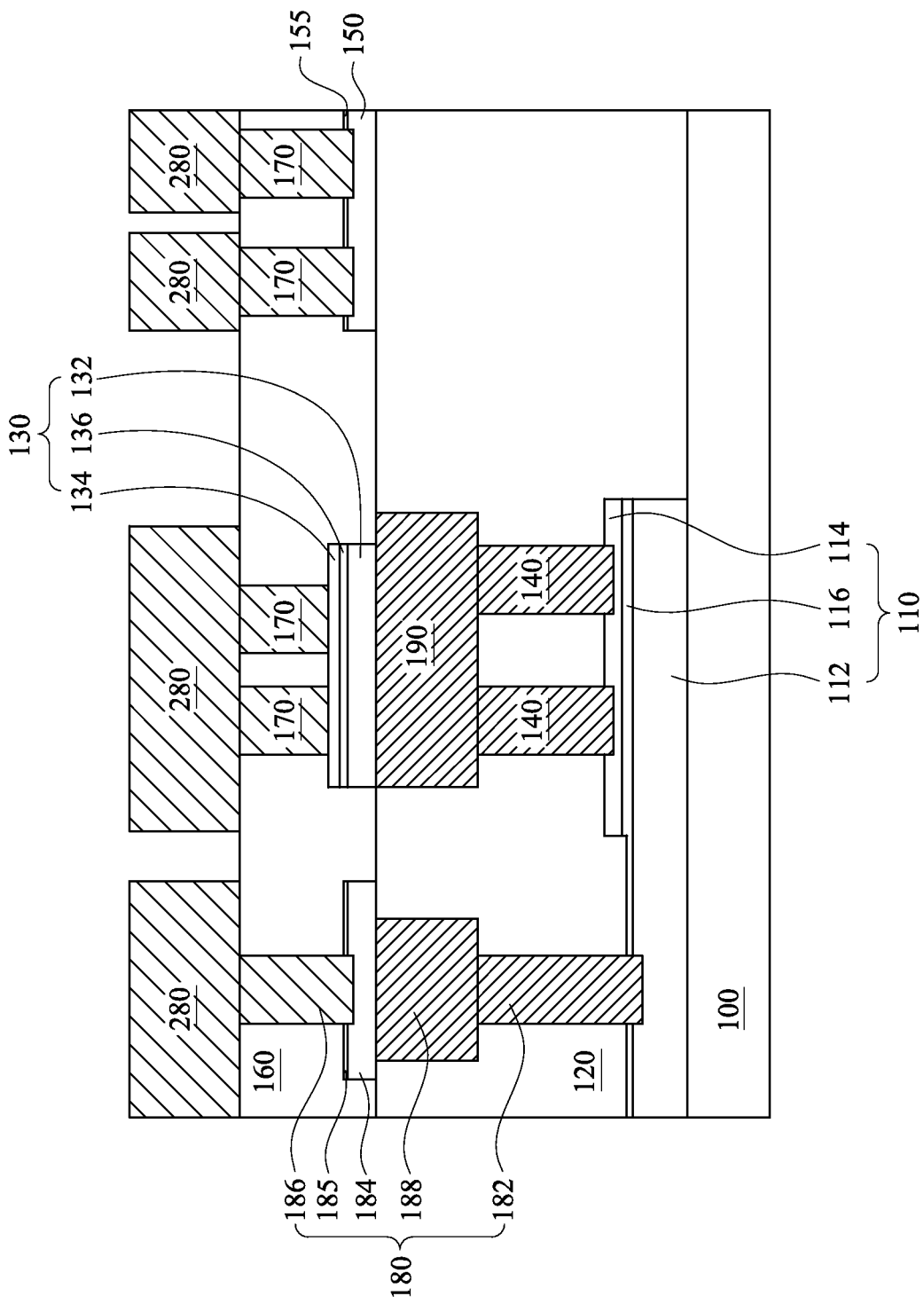
FIG. 2 is a schematic view of at least a portion of an integrated circuit according to various embodiments of the present disclosure.

FIG. 2 is a schematic view of at least a portion of an integrated circuit according to various embodiments of the present disclosure. The integrated circuit includes a first capacitor 110, a first dielectric layer 120, a second capacitor 130, at least one first via 140, a thin film resistor 150, a second dielectric layer 160, and a plurality of second vias 170. The positions of above elements and the connections between them are similar to those described above, and therefore the details are omitted here. The differences between the integrated circuit illustrated in FIG. 2 and that in FIG. 1 is that the integrated circuit illustrated in FIG. 2 further includes a first interlayer metal pad 190. The first interlayer metal pad 190 is disposed between the capacitor bottom metal 132 of the second capacitor 130 and the plurality of first vias 140. The first interlayer metal pad 190 is made of conductive materials. In various embodiments of the present disclosure, the first interlayer metal pad 190 is made of copper. As shown in FIG. 2, the first interlayer metal pad 190 connected to the capacitor bottom metal 132 further reduces the resistance of the capacitor bottom metal 132 of the second capacitor 130, and therefore increases the quality factor (Q) of the second capacitor 130. Accordingly, the stacked metal-insulator-metal (MIM) capacitor, which includes the first capacitor 110 and the second capacitor 130, can provide higher quality factor characteristics when being operated in high frequency.

Figure 3:
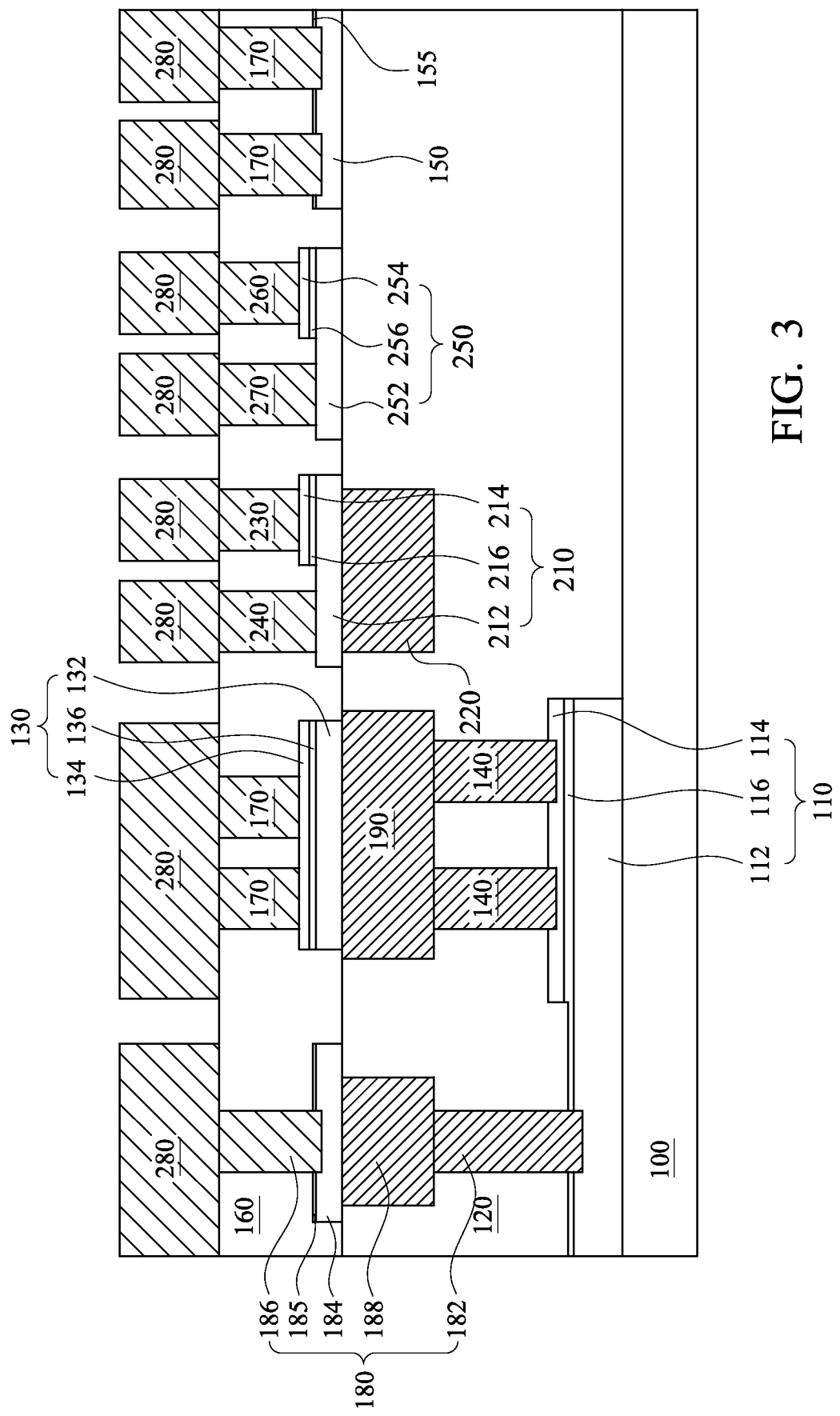
FIG. 3 is a schematic view of at least a portion of an integrated circuit according to various embodiments of the present disclosure.

FIG. 3 is a schematic view of at least a portion of an integrated circuit according to various embodiments of the present disclosure. The integrated circuit includes a first capacitor 110, a first dielectric layer 120, a second capacitor 130, at least one first via 140, a thin film resistor 150, a second dielectric layer 160, and a plurality of second vias 170. The positions of above elements and the connections between them are similar to those described above, and therefore the details are omitted here. The differences between the integrated circuit illustrated in FIG. 3 and that in FIG. 2 is that the integrated circuit illustrated in FIG. 3 further includes a third capacitor 210, a second interlayer metal pad 220, at least one fourth via 230, and at least one fifth via 240. The third capacitor 210 is disposed on the first dielectric layer 120. The third capacitor 210 has a capacitor bottom metal 212, a capacitor top metal 214, and an inter-electrode dielectric layer 216. In various embodiments of the present disclosure, the inter-electrode dielectric layer 216 of the third capacitor 210 is sandwiched by the capacitor bottom metal 212 and the capacitor top metal 214 of the second capacitor 210. The second interlayer metal pad 220 is disposed below the capacitor bottom metal 212 of the third capacitor 210 and electrically contacted to the capacitor bottom metal 212 of the third capacitor 210. In various embodiments of the present disclosure, the first interlayer metal pad 190, the second interlayer metal pad 220, and the first via 140 are made of copper. The fourth via 230 is disposed in the second dielectric layer 160 and electrically connected to the capacitor top metal 214 of the third capacitor 210. The fifth via 240 is disposed in the second dielectric layer 160 and electrically connected to the capacitor bottom metal 212 of the third capacitor 210. As shown in FIG. 3, the second interlayer metal pad 220 connected to the capacitor bottom metal 132 reduces the resistance of the capacitor bottom metal 212 of the third capacitor 210, and therefore increases the quality factor (Q) of the third capacitor 130. Accordingly, the third capacitor 130 can provide high-Q characteristics when being operated in high frequency. Besides, another two bonding pads 280, which are respectively connected to the fourth via 230 and the fifth via 240, are electrically connected to the third capacitor 210. These two bonding pads 280 can be respectively regarded as an input or an output of the third capacitor 210. Similarly, the bonding pads 280 may be further formed a bonding wire, a metal clip or a bump to electrically connect to a circuit board or other semiconductor chips.

It should be noticed that the capacitor bottom metal 212, the capacitor top metal 214, and the inter-electrode dielectric layer 216 of the third capacitor 210 are respectively at the same layers as those of the second capacitor 130. In other words, the capacitor bottom metal 212 of the third capacitor 210 and the capacitor bottom metal 132 of the second capacitor 130 are substantially at the same layer; the top metal 214 of the third capacitor 210 and the capacitor top metal 134 of the second capacitor 130 are substantially at the same layer; the inter-electrode dielectric layer 216 of the third capacitor 210 and the inter-electrode dielectric layer 136 of the second capacitor 130 are substantially at the same layer. Therefore, the third capacitor 210 can be simultaneously fabricated when the second capacitor 130 is fabricated. In other words, the stacked MIM capacitor (the first capacitor 110 and the second capacitor 130), the high-Q MIM capacitor (the third capacitor 210), and the thin film resistor 150 can be fabricated in one integrated circuit at the same time, and the cost of manufacturing the integrated circuit with multi-functions (the stacked metal-insulator-metal (MIM) capacitor, the high-Q MIM capacitor, and the thin film resistor 150) can be further reduced.

Also illustrated in FIG. 3, in various embodiments of the present disclosure, the integrated circuit further includes a fourth capacitor 250, at least one sixth via 260, and at least one seventh via 270. The fourth capacitor 250 is disposed on the first dielectric layer 120. The fourth capacitor 250 has a capacitor bottom metal 252, a capacitor top metal 254, and an inter-electrode dielectric layer 256. The sixth via 260 is disposed in the second dielectric layer 160 and is electrically connected to the capacitor top metal 254 of the fourth capacitor 250. The seventh via 270 is disposed in the second dielectric layer 160 and is electrically connected to the capacitor bottom metal 252 of the fourth capacitor 250. As shown in FIG. 3, since there is not an interlayer metal pad connected to the capacitor bottom metal 252, the fabrication of the fourth capacitor 250 is independent of the fabrication of interlayer metal pad, and therefore reduce the risk of mismatch which may caused by the process variation of the fabrication of interlayer metal pad. Accordingly, the third capacitor 130 can provide high-match characteristics. Besides, another two bonding pads 280, which are respectively connected to the sixth via 260 and the seventh via 270, are electrically connected to the fourth capacitor 250. These two bonding pads 280 can be respectively regarded as an input or an output of the fourth capacitor 250. Similarly, the bonding pads 280 may also be further formed a bonding wire, a metal clip or a bump to electrically connect to a circuit board or other semiconductor chips.

It should be noticed that the capacitor bottom metal 252, the capacitor top metal 254, and the inter-electrode dielectric layer 256 of the fourth capacitor 250 are respectively at the same layers as those of the second capacitor 130. In other words, the capacitor bottom metal 252 of the fourth capacitor 250 and the capacitor bottom metal 132 of the second capacitor 130 are substantially at the same layer; the top metal 254 of the fourth capacitor 250 and the capacitor top metal 134 of the second capacitor 130 are substantially at the same layer; the inter-electrode dielectric layer 256 of the fourth capacitor 250 and the inter-electrode dielectric layer 136 of the second capacitor 130 are substantially at the same layer. Therefore, the fourth capacitor 250 can be simultaneously fabricated when the second capacitor 130 is fabricated. In other words, the stacked MIM capacitor (the first capacitor 110 and the second capacitor 130), the high-match MIM capacitor (the fourth capacitor 250), and the thin film resistor 150 can be fabricated in one integrated circuit at the same time. Furthermore, in various embodiments of the present disclosure, the stacked MIM capacitor (the first capacitor 110 and the second capacitor 130), the high-Q MIM capacitor (the third capacitor 210), the high-match MIM capacitor (the fourth capacitor 250), and the thin film resistor 150 can be fabricated in one integrated circuit at the same time. Accordingly, the cost of manufacturing the integrated circuit with multi-functions (the stacked metal-insulator-metal (MIM) capacitor, the high-Q MIM capacitor, the high-match MIM capacitor, and the thin film resistor 150) can be further reduced.

Figure 4:
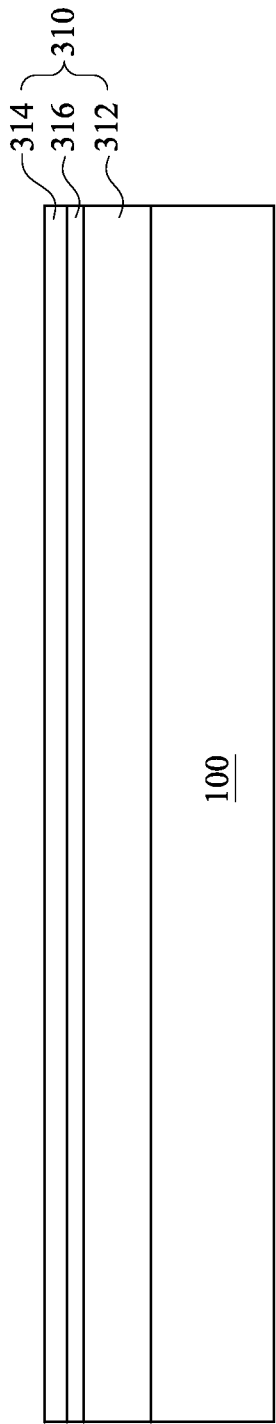
FIG. 4 is a schematic view of at least a portion of an integrated circuit in an intermediate stage of manufacture according to various embodiments of the present disclosure.

A method for fabricating an integrated circuit according to various embodiments of the present disclosure will now be described in conjunction with FIG. 4-17. FIG. 4 is a schematic view of at least a portion of an integrated circuit in an intermediate stage of manufacture according to various embodiments of the present disclosure. A first film lamination 310 including a capacitor bottom metal film 312, an inter-electrode dielectric film 316, and a capacitor top metal film 314 is formed on a semiconductor substrate 100. The first film lamination 310 may be formed by sequentially depositing the capacitor bottom metal film 312, the inter-electrode dielectric film 316, and the capacitor top metal film 314. The capacitor bottom metal film 312, the inter-electrode dielectric film 316, and the capacitor top metal film 314 may be respectively formed by suitable processes, such as CVD, PVD, ALD, HDPCVD, MOCVD, RPCVD, PECVD, PLD, other suitable techniques, or combinations thereof. In various embodiments of the present disclosure, the capacitor bottom metal film 312 is a film lamination consisting of two titanium nitride (TiN) films and an aluminum-copper alloy (AlCu) film which is sandwiched by the two TiN films. In various embodiments of the present disclosure, the inter-electrode dielectric film 316 is a multi-layers structure consisting of a silicon oxide ($SiO_2$) film, a silicon nitride ($Si_xN_y$) film, a hafnium oxide ($HfO_2$) film, a zirconium oxide ($ZrO_2$) film, or an aluminum oxide ($Al_2O_3$) film.

Figure 5:
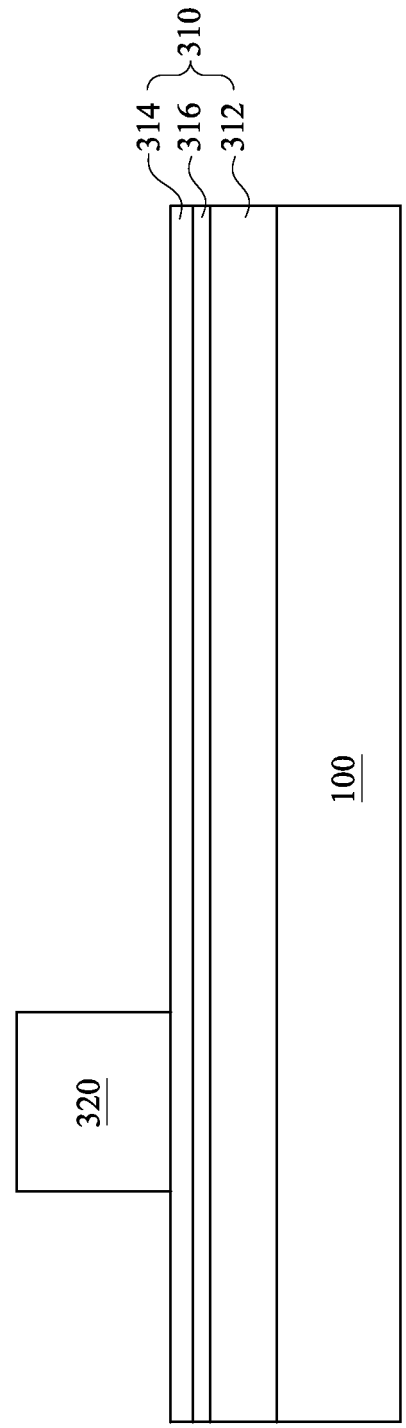
FIG. 5 is schematic views of the integrated circuit shown in FIG. 4 in a subsequent stage of manufacture according to various embodiments of the present disclosure.
Figure 6:
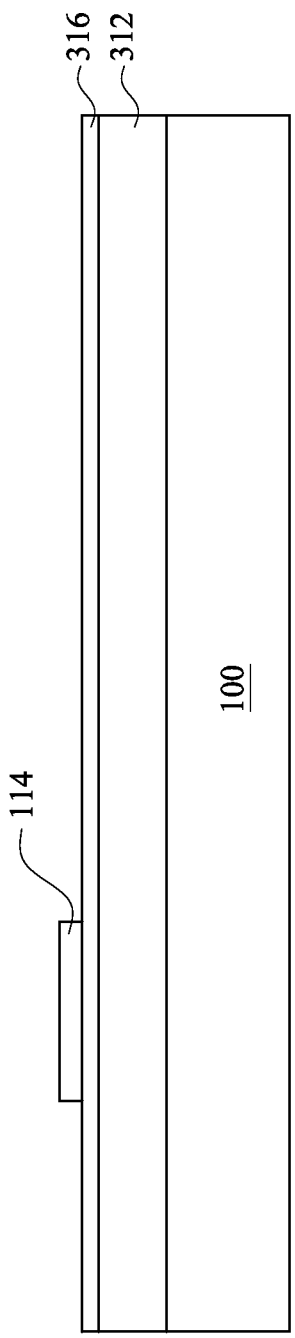
FIG. 6 is schematic views of the integrated circuit shown in FIG. 5 in a subsequent stage of manufacture according to various embodiments of the present disclosure.
Figure 7:
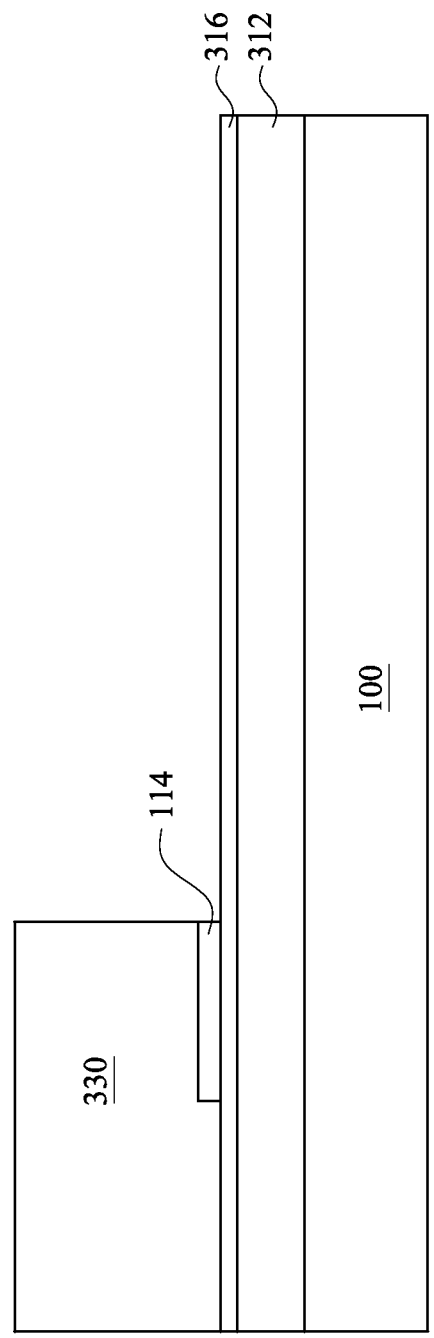
FIG. 7 is schematic views of the integrated circuit shown in FIG. 6 in a subsequent stage of manufacture according to various embodiments of the present disclosure.

FIGS. 5-8 are schematic views of the integrated circuit shown in FIG. 4 in a subsequent stage of manufacture according to various embodiments of the present disclosure. The first film lamination 310 is patterned to form a first capacitor 110 having a capacitor bottom metal 112, an inter-electrode dielectric layer 116, and a capacitor top metal 114. As illustrated in FIG. 5, a photo resist mask 320 may be formed on the capacitor top metal film 314 to delineate where the capacitor top metal 114 is desired. The capacitor top metal film 314 is then etched with a suitable etchant. The photo resist mask 320 is then stripped, and the capacitor top metal film 314 is formed as shown in FIG. 6. As illustrated in FIG. 7, another photo resist mask 330 may be formed on the capacitor top metal film 314, the capacitor bottom metal film 312, and the inter-electrode dielectric film 316 to delineate where the capacitor bottom metal 112 and the inter-electrode dielectric layer 116 are desired. The capacitor bottom metal film 312 and the inter-electrode dielectric film 316 are both etched with a suitable etchant. The photo resist mask 330 is then stripped, and the capacitor bottom metal 112 and the inter-electrode dielectric layer 116 are formed as shown in FIG. 8. It should be noticed that the capacitor bottom metal film 312 remains larger area than that of the capacitor top metal film 314 to conveniently form electrical connections of the capacitor bottom metal 112 in the following steps.

Figure 10:
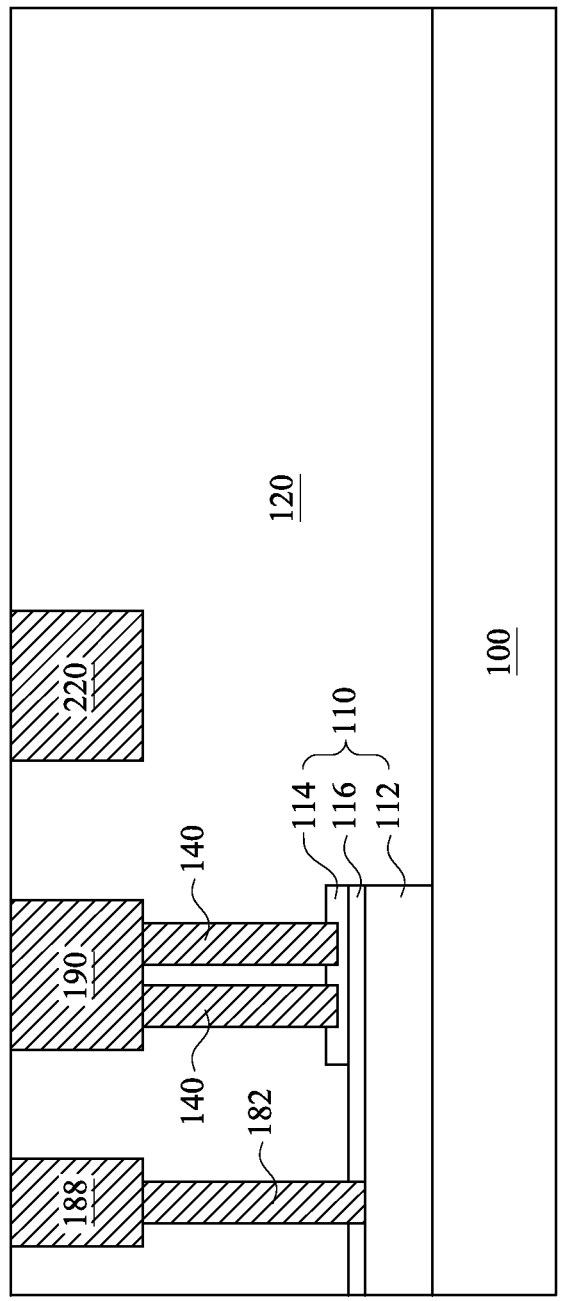
FIG. 10 is a schematic view of the integrated circuit shown in FIG. 9 in a subsequent stage of manufacture according to various embodiments of the present disclosure.

FIG. 9 is a schematic view of the integrated circuit shown in FIG. 8 in a subsequent stage of manufacture according to various embodiments of the present disclosure. A first dielectric layer 120 is deposited to cover the first capacitor 110. The first dielectric layer 120 may be formed by a suitable process, such as CVD, PVD, ALD, HDPCVD, MOCVD, RPCVD, PECVD, PLD, other suitable techniques, or combinations thereof. The first dielectric layer 120 may be formed of silicon oxide ($SiO_2$), silicon nitride ($Si_xN_y$), or the combination thereof. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, inter-level dielectric materials such as undoped silica glass (USG), phosphor doped silicate glass (PSG), fluorine doped silicate glass (FSG), a boron doped silicate glass (BSG) layer, or a boron phosphorous-doped silicate glass (BPSG) layer may be used. At least one first via 140 and at least one eighth via 182 penetrating the first dielectric layer 120 are formed. The first via 140 is electrically connected to the capacitor top metal 114 of the first capacitor 110. The eighth via 182 is electrically connected to the capacitor bottom metal 112 of the first capacitor 110. As illustrated in FIG. 10, in various embodiments of the present disclosure, at least one first interlayer metal pad 190 is formed to electrically connect to the first via 140. The first interlayer metal pad 190 is predetermined to electrically connect to a capacitor bottom metal film of a second film lamination formed in the following steps. Also shown in FIG. 10, in various embodiments of the present disclosure, at least one second interlayer metal pad 220 is also formed to be predetermined to electrically connect to a capacitor bottom metal film of a second film lamination formed in the following steps. The difference between the second interlayer metal pad 220 and the first interlayer metal pad 190 is that the second interlayer metal pad 220 is not electrically connected to the first via 140, but the first interlayer metal pad 190 is.

Figure 11:
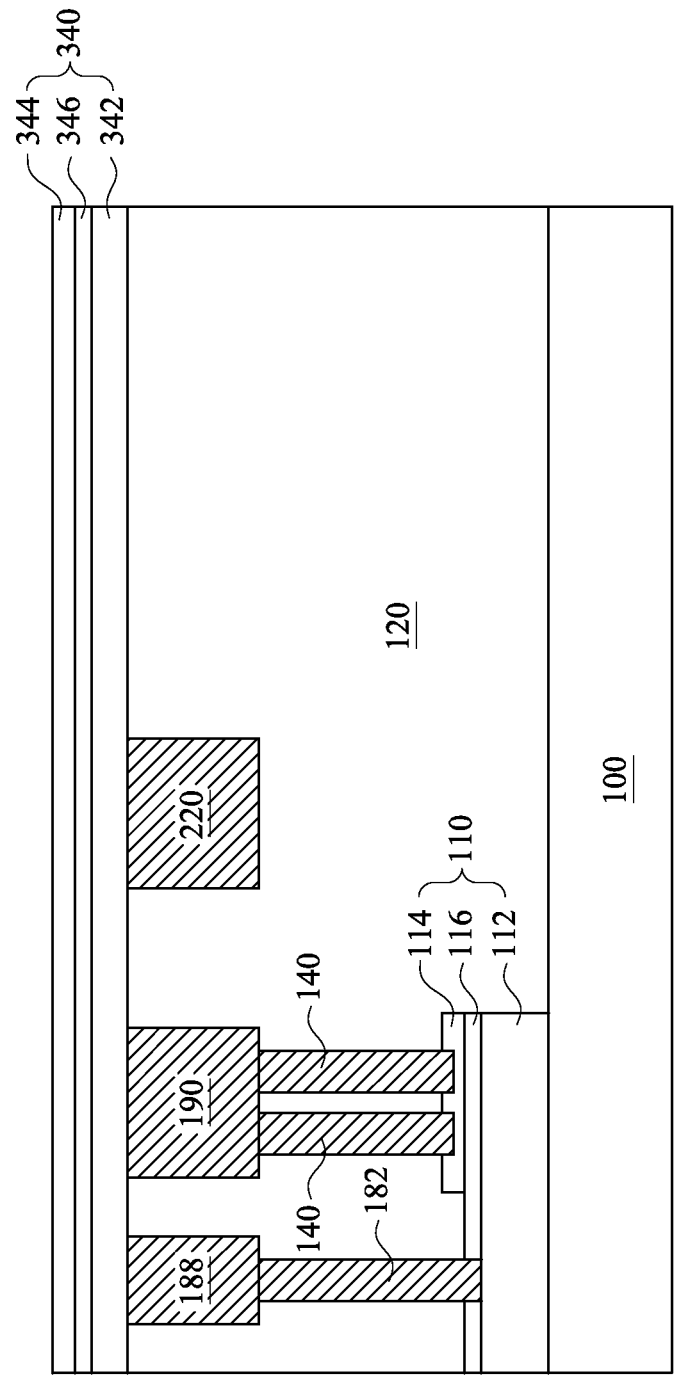
FIG. 11 is a schematic view of the integrated circuit shown in FIG. 10 in a subsequent stage of manufacture according to various embodiments of the present disclosure.

FIG. 11 is a schematic view of the integrated circuit shown in FIG. 10 in a subsequent stage of manufacture according to various embodiments of the present disclosure. A second film lamination 340 including a capacitor bottom metal film 342, an inter-electrode dielectric film 346, and a capacitor top metal film 344 is formed on the first dielectric layer 120. The second film lamination 340 may be formed by sequentially depositing the capacitor bottom metal film 342, the inter-electrode dielectric film 346, and the capacitor top metal film 344. The capacitor bottom metal film 342, the inter-electrode dielectric film 346, and the capacitor top metal film 344 may be respectively formed by suitable processes, such as CVD, PVD, ALD, HDPCVD, MOCVD, RPCVD, PECVD, PLD, other suitable techniques, or combinations thereof. In various embodiments of the present disclosure, the capacitor bottom metal film 312 is made of tantalum nitride (TaN), titanium nitride (TiN), silicon-chrome (SiCr), tantalum, or the combination thereof. In various embodiments of the present disclosure, the inter-electrode dielectric film 346 is a multi-layers structure consisting of a silicon oxide ($SiO_2$) film, a silicon nitride ($Si_xN_y$) film, a hafnium oxide ($HfO_2$) film, a zirconium oxide ($ZrO_2$) film, or an aluminum oxide ($Al_2O_3$) film. In various embodiments of the present disclosure, the capacitor top metal film 344 is made of tantalum nitride (TaN), titanium nitride (TiN), aluminium-copper alloy (AlCu), or the combination thereof.

Figure 12:
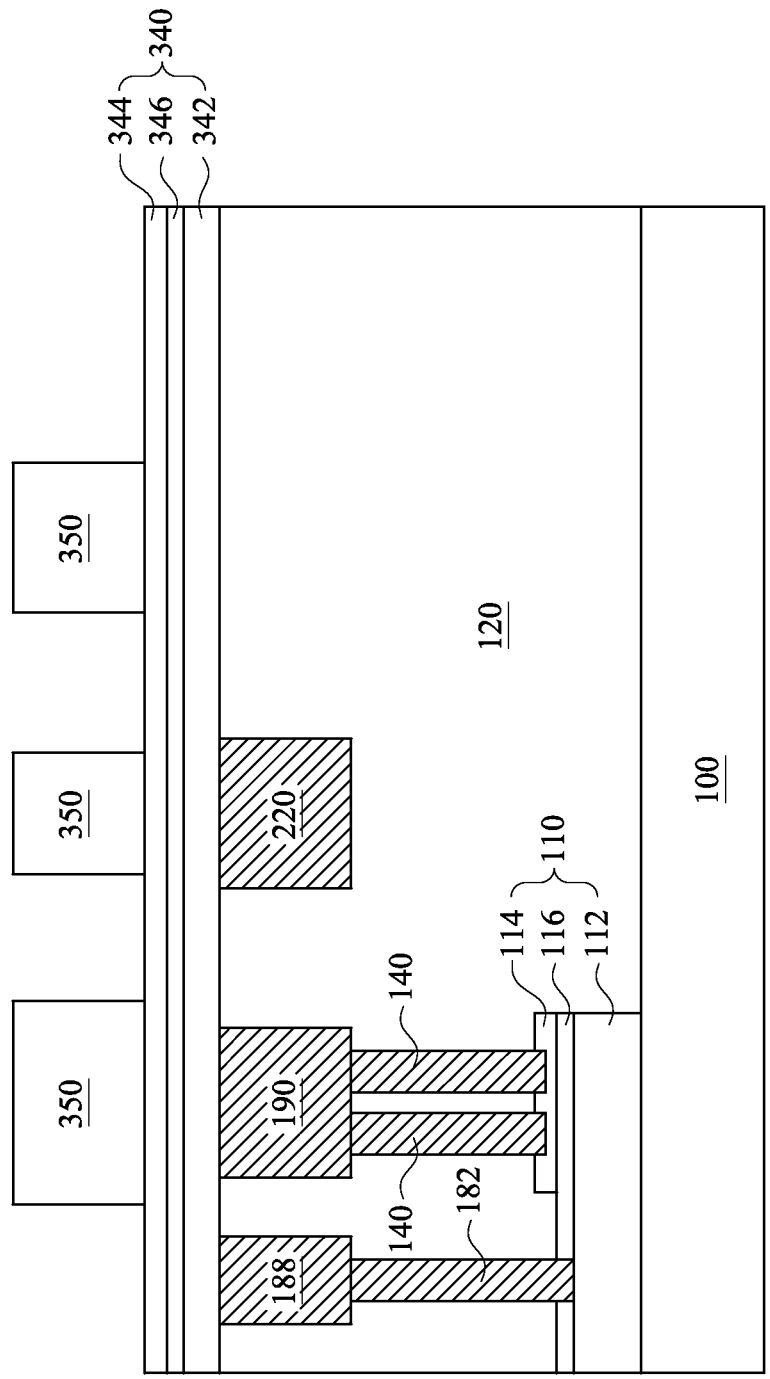
FIG. 12 is a schematic view of the integrated circuit shown in FIG. 11 in a subsequent stage of manufacture according to various embodiments of the present disclosure.
Figure 13:
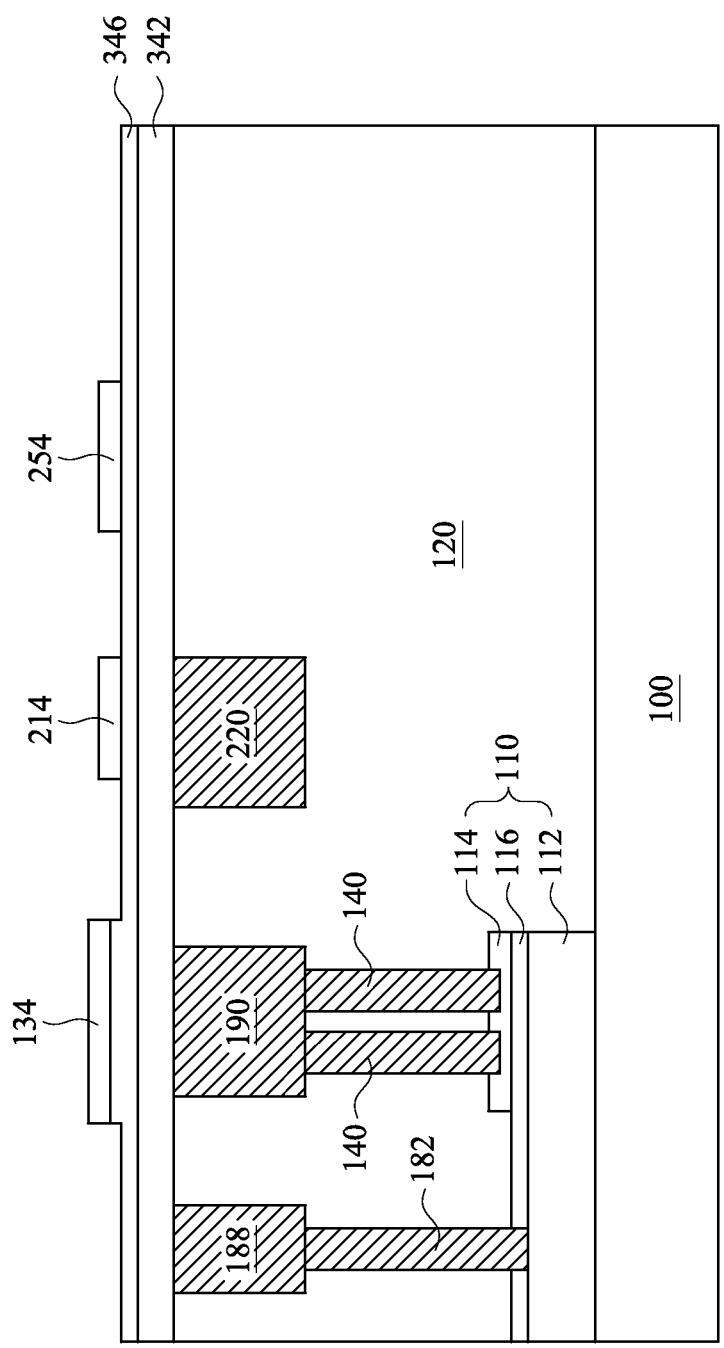
FIG. 13 is a schematic view of the integrated circuit shown in FIG. 12 in a subsequent stage of manufacture according to various embodiments of the present disclosure.
Figure 14:
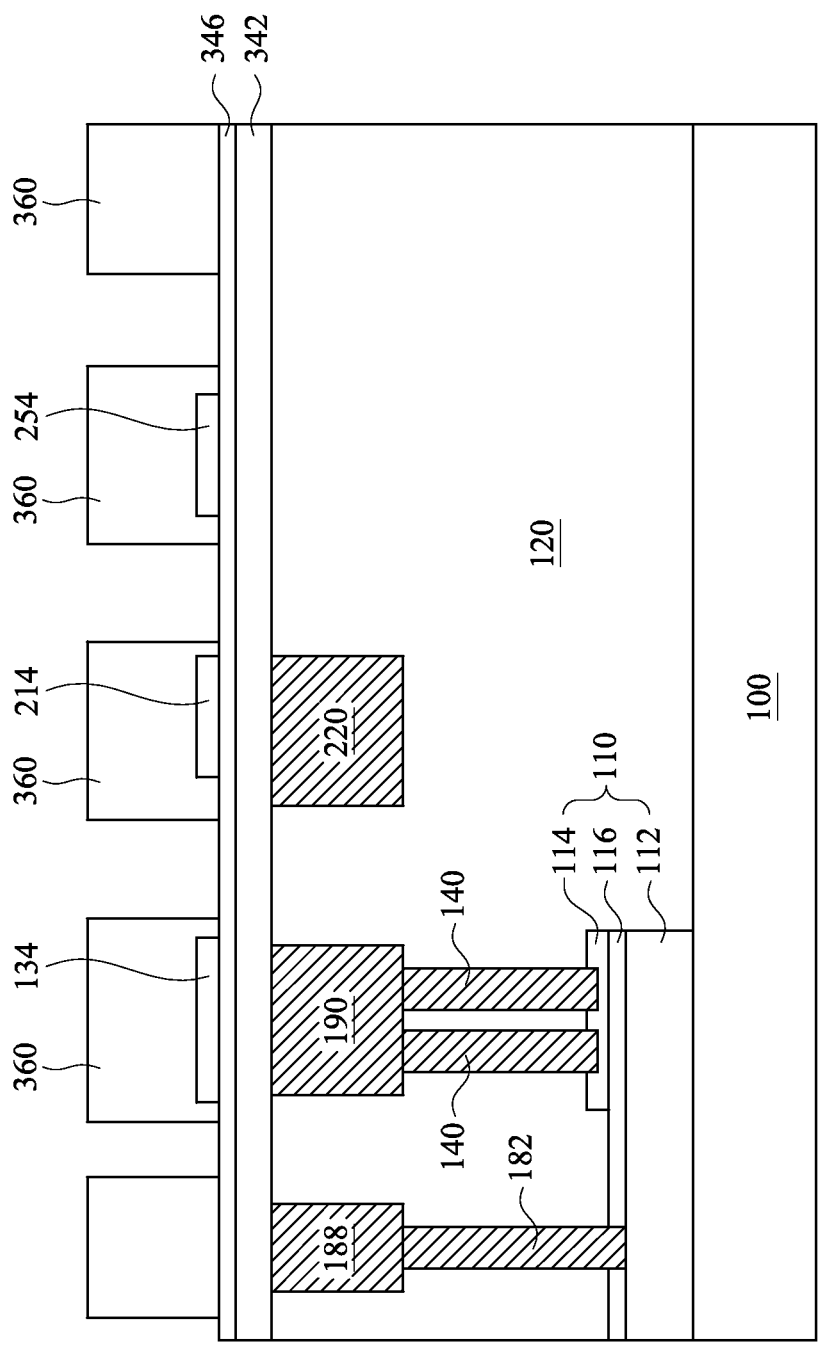
FIG. 14 is a schematic view of the integrated circuit shown in FIG. 13 in a subsequent stage of manufacture according to various embodiments of the present disclosure.
Figure 15:
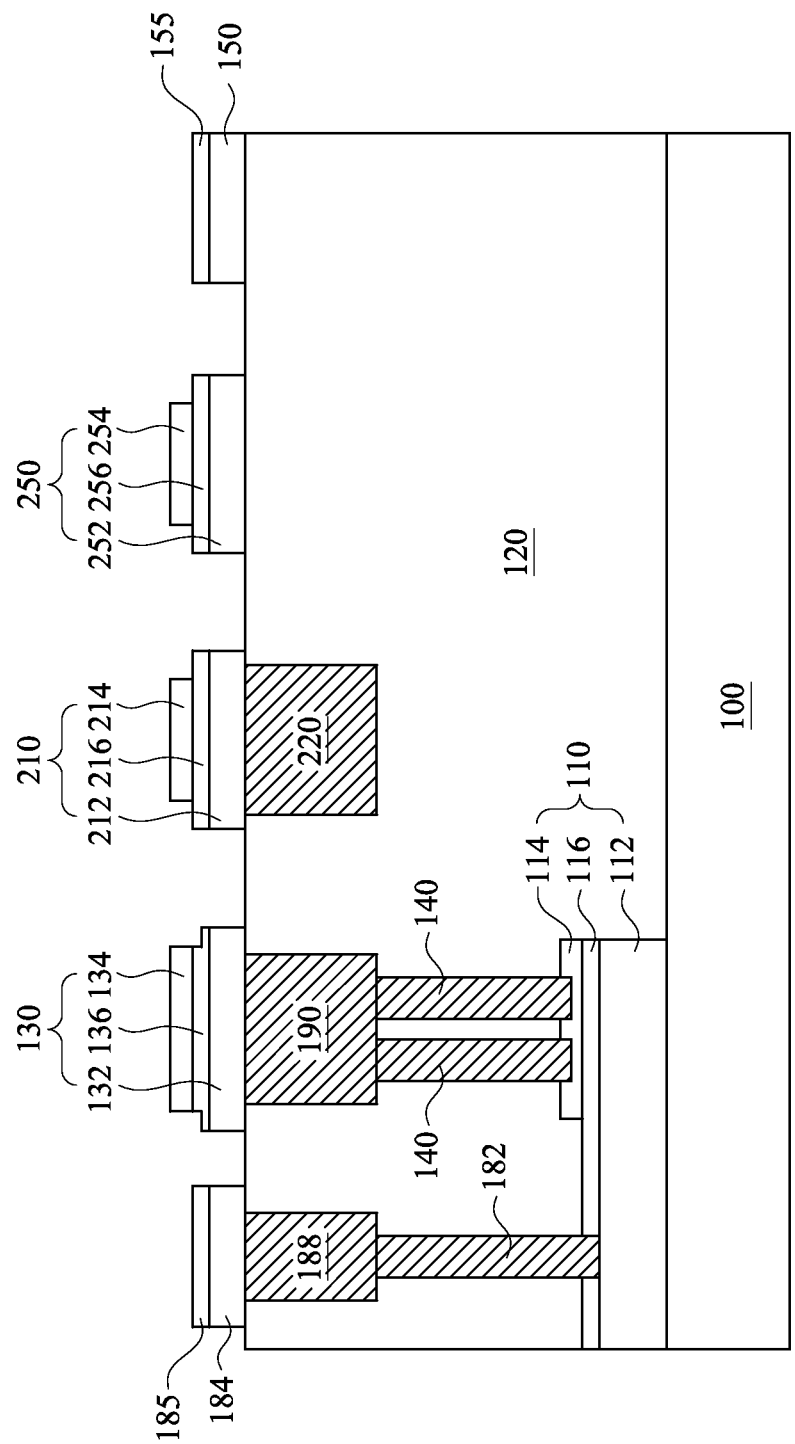
FIG. 15 is a schematic view of the integrated circuit shown in FIG. 14 in a subsequent stage of manufacture according to various embodiments of the present disclosure.

FIGS. 12-15 are schematic views of the integrated circuit shown in FIG. 11 in a subsequent stage of manufacture according to various embodiments of the present disclosure. As illustrated in FIG. 12-15, the second film lamination 340 is patterned to form a second capacitor 130 and a thin film resistor 150. The second capacitor 130 has a capacitor bottom metal 132, an inter-electrode dielectric layer 136, and a capacitor top metal 134. In various embodiments of the present disclosure, the second film lamination 340 is patterned to further form a third capacitor 210. The third capacitor 210 has a capacitor bottom metal 212, an inter-electrode dielectric layer 216, and a capacitor top metal 214. In various embodiments of the present disclosure, the second film lamination 340 is patterned to further form a fourth capacitor 250. The fourth capacitor 250 has a capacitor bottom metal 252, an inter-electrode dielectric layer 256, and a capacitor top metal 254. As illustrated in FIG. 12, photo resist masks 350 may be formed on the capacitor top metal film 344 to delineate where the capacitor top metal 134 of the second capacitor 130, the capacitor top metal 214 of the third capacitor 210, and the capacitor top metal 254 of the fourth capacitor 250 are desired. The capacitor top metal film 344 is then etched with a suitable etchant. The photo resist masks 350 is then stripped, and the capacitor top metal film 134 of the second capacitor 130, the capacitor top metal 214 of the third capacitor 210, and the capacitor top metal 254 of the fourth capacitor 250 are formed as shown in FIG. 13. As illustrated in FIG. 14, another photo resist mask 360 may be formed on the inter-electrode dielectric film 346, the capacitor top metal film 134 of the second capacitor 130, the capacitor top metal 214 of the third capacitor 210, and the capacitor top metal 254 to delineate where the capacitor bottom metals and the inter-electrode dielectric layers are desired. The capacitor bottom metal film 342 and the inter-electrode dielectric film 346 are both etched with a suitable etchant. The photo resist mask 360 is then stripped, and the capacitor bottom metals 132, 212, and 252 of the second capacitor 130, the third capacitor 210, and the fourth capacitor 250 and the inter-electrode dielectric layers 136, 216, and 256 of the second capacitor 130, the third capacitor 210, and the fourth capacitor 250 are formed as shown in FIG. 15. It should be noticed that the capacitor bottom metal film 342 remain larger area than those of the capacitor top metal films 344 to conveniently form electrical connections of the capacitor bottom metal 132 of the second capacitor 130, the capacitor bottom metal 212 of the third capacitor 210, and the capacitor bottom metal 252 of the fourth capacitor 250 in the following steps.

Figure 16:
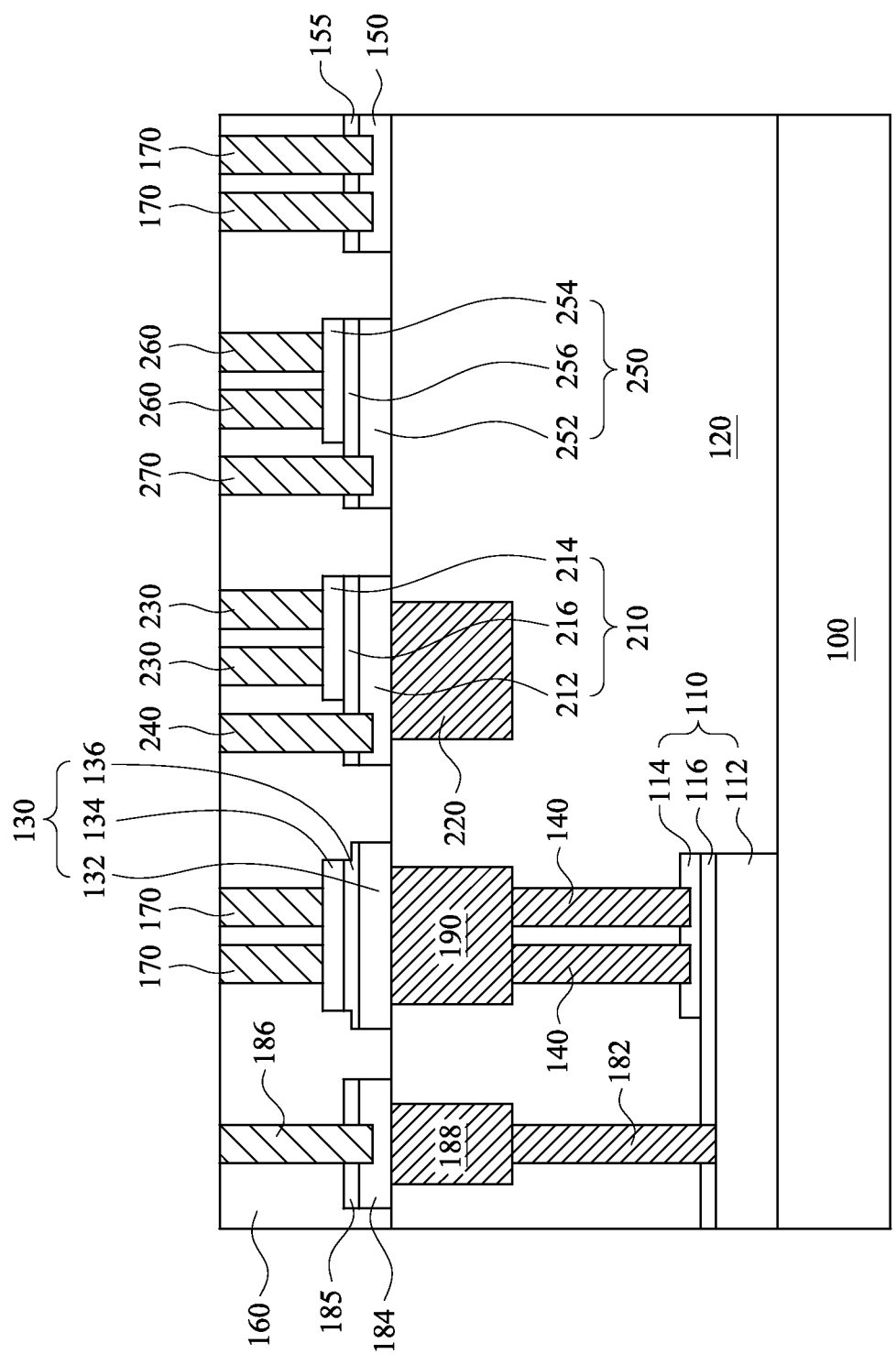
FIG. 16 is a schematic view of the integrated circuit shown in FIG. 15 in a subsequent stage of manufacture according to various embodiments of the present disclosure.

FIG. 16 is a schematic view of the integrated circuit shown in FIG. 15 in a subsequent stage of manufacture according to various embodiments of the present disclosure. A second dielectric layer 160 is deposited to cover the first dielectric layer 120, the second capacitor 130, and the thin film resistor 150. In some embodiments of the present disclosure, the second dielectric layer 160 is deposited to cover the first dielectric layer 120, the second capacitor 130, the third capacitor 210, and the thin film resistor 150. In other some embodiments of the present disclosure, the second dielectric layer 160 is deposited to cover the first dielectric layer 120, the second capacitor 130, the third capacitor 210, the fourth capacitor 250, and the thin film resistor 150. The processes of forming the second dielectric layer 160 and the materials of the second dielectric layer 160 are similar to those of the first dielectric layer 120, and therefore the details are omitted here. A plurality of second vias 170 and at least one ninth via 186 penetrating the second dielectric layer 160 are formed. The plurality of second vias 170 is electrically connected to the capacitor top metal 134 of the second capacitor 130 and the thin film resistor 150 respectively. The ninth via 186 is electrically connected to the capacitor bottom metal 112 of the first capacitor 110. In various embodiments of the present disclosure, at least one fourth via 230 penetrating the second dielectric layer 160 is formed. The fourth via 230 is connected to the capacitor top metal 214 of the third capacitor 210. And at least one fifth via 240 penetrating the second dielectric layer 160 is formed. The fifth via 240 is connected to the capacitor bottom metal 212 of the third capacitor 210. In various embodiments of the present disclosure, forming at least one sixth via 260 penetrating the second dielectric layer 160 is formed. The sixth via 260 is electrically connected to the capacitor top metal 254 of the fourth capacitor 250. And at least one seventh via 270 penetrating the second dielectric layer 160 is formed. The seventh via 270 is electrically connected to the capacitor bottom metal 252 of the fourth capacitor 250. Aforementioned vias 170, 186, 230, 240, 260, and 270 may be formed by litho-etching the second dielectric layer 160 to produce corresponding openings in the second dielectric layer 160. And the corresponding openings are fulfilled with a conductive materials such as metals or metal alloys.

Figure 17:
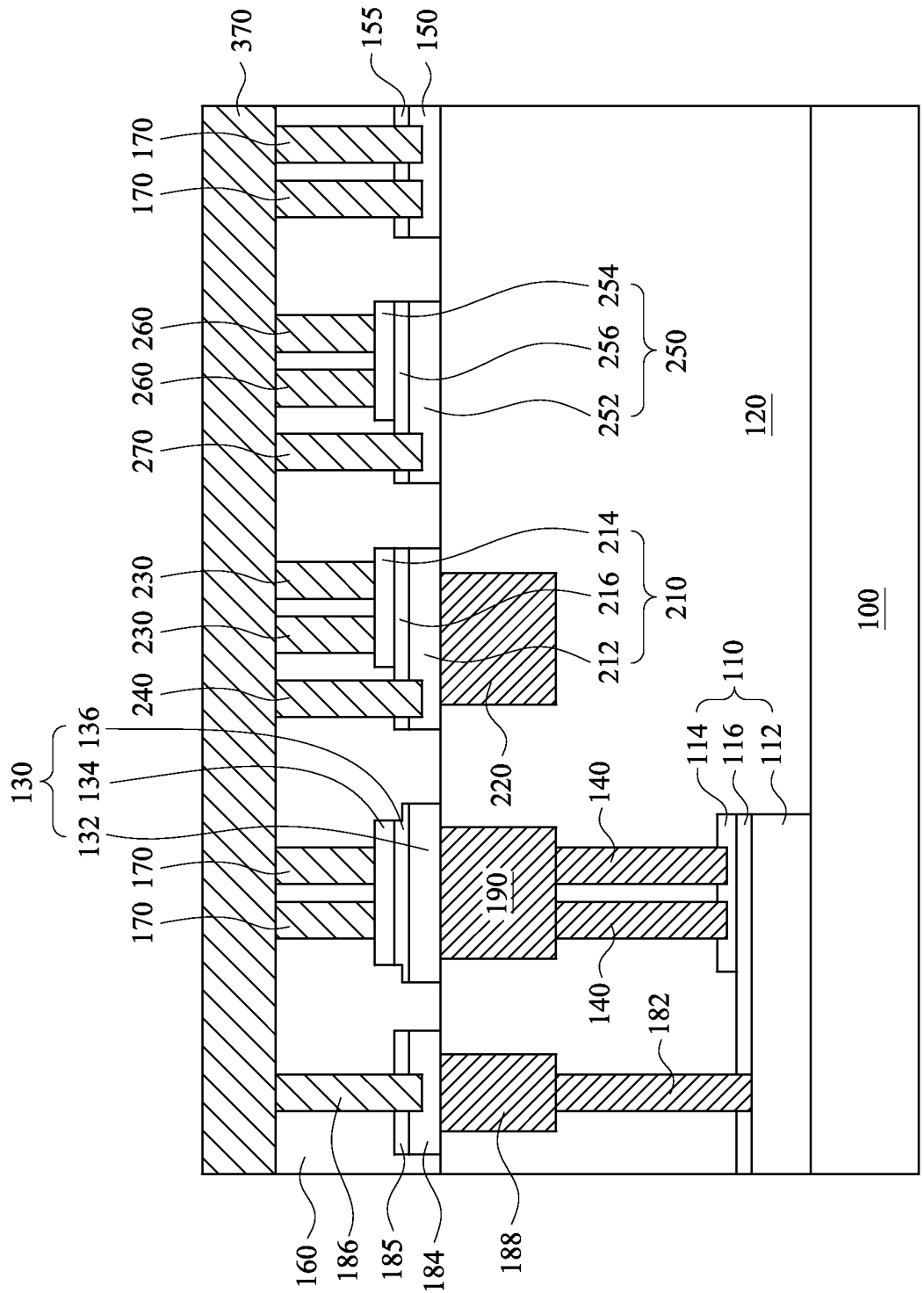
FIG. 17 is a schematic view of the integrated circuit shown in FIG. 16 in a subsequent stage of manufacture according to various embodiments of the present disclosure.
Figure 18:
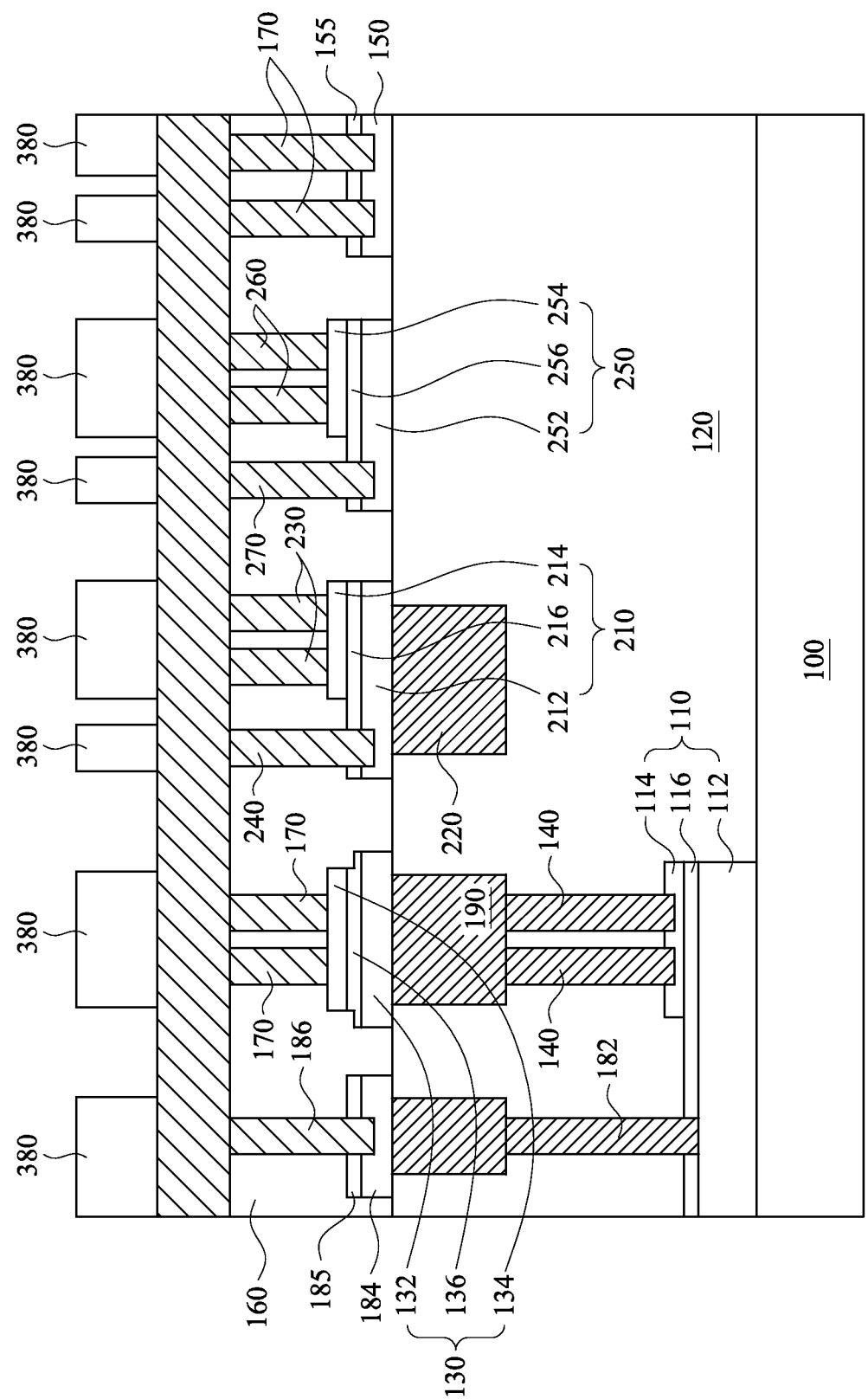
FIG. 18 is a schematic view of the integrated circuit shown in FIG. 17 in a subsequent stage of manufacture according to various embodiments of the present disclosure.
Figure 19:
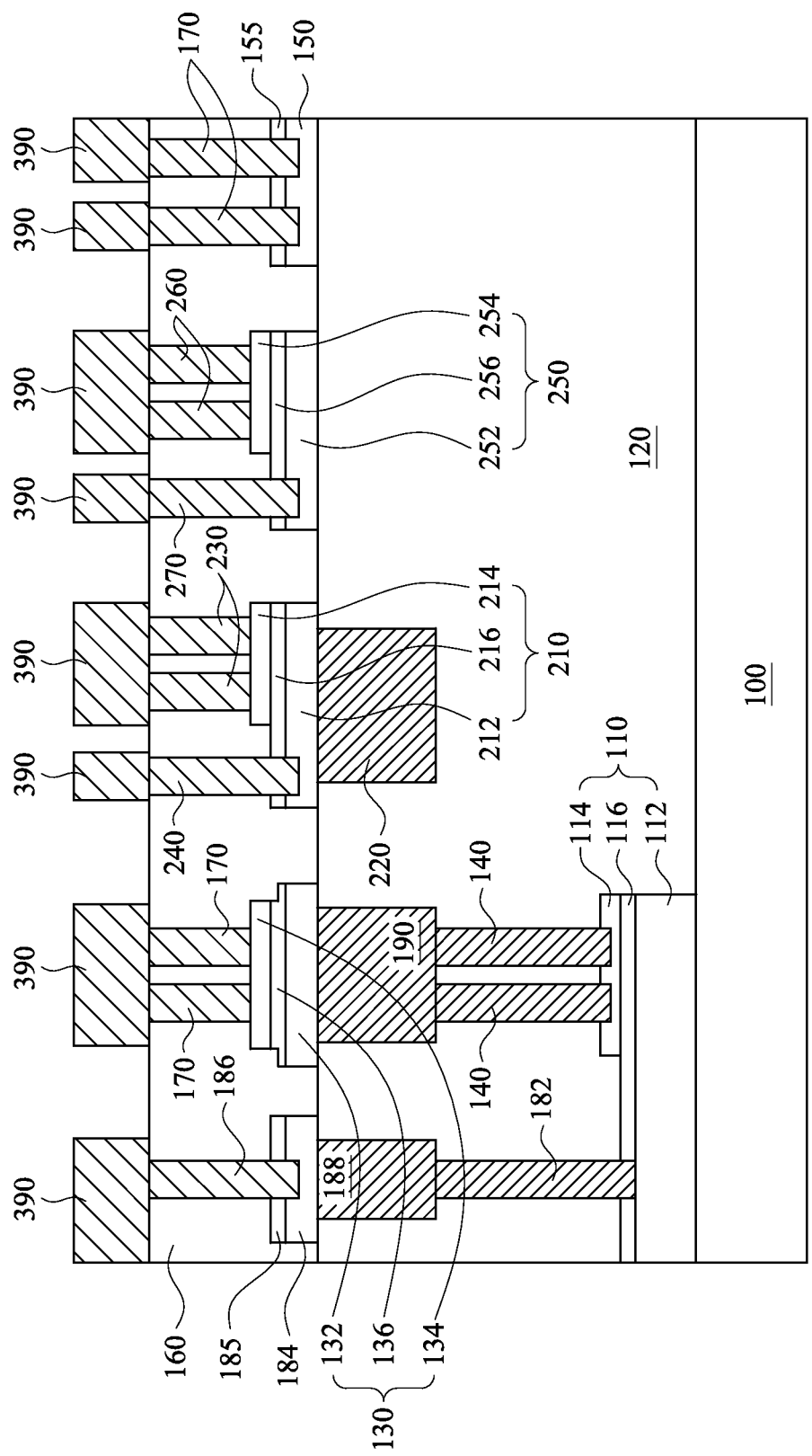
FIG. 19 is a schematic view of the integrated circuit shown in FIG. 18 in a subsequent stage of manufacture according to various embodiments of the present disclosure.

FIGS. 17-19 are schematic views of the integrated circuit shown in FIG. 16 in a subsequent stage of manufacture according to various embodiments of the present disclosure. As shown in FIG. 19, a plurality of bonding pads 390 disposed on the second dielectric layer 160 is formed. At least one of the plurality of bonding pads 390 is electrically connected to the capacitor bottom metal 112 of the first capacitor 110. At least another one of the plurality of bonding pads 390 is electrically connected to the capacitor top metal 134 of the second capacitor 130, and at least one of the plurality of bonding pads 390 are electrically connected to the thin film resistor 150. In various embodiments of the present disclosure, at least another one of the plurality of bonding pads 390 is electrically connected to the capacitor bottom metal 212 of the third capacitor 210, and at least another one of the plurality of bonding pads 390 is electrically connected to the capacitor top metal 214 of the third capacitor 210. In various embodiments of the present disclosure, at least another one of the plurality of bonding pads 390 is electrically connected to the capacitor bottom metal 252 of the third capacitor 250, and at least another one of the plurality of bonding pads 390 is electrically connected to the capacitor top metal 254 of the third capacitor 250. The plurality of bonding pads 390 may be formed as illustrated in FIG. 17, a conductive layer 370 is formed on the second dielectric layer 160. The conductive layer 370 is electrically connected to aforementioned vias 170, 186, 230, 240, 260, and 270. As illustrated in FIG. 18, a photo resist mask 380 may be formed on the conductive layer 370 to delineate where the plurality of bonding pads 390 is desired. The conductive layer 370 is then etched with a suitable etchant. The photo resist mask 380 is then stripped, and the plurality of bonding pads 390 is formed as shown in FIG. 19.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an integrated circuit, comprising:

forming a first film lamination including a capacitor bottom metal film, an inter-electrode dielectric film, and a capacitor top metal film on a semiconductor substrate;

patterning the capacitor top metal film to form a capacitor top metal of a first capacitor;

patterning the inter-electrode dielectric film and the capacitor bottom metal film to form the first capacitor having a capacitor bottom metal, an inter-electrode dielectric layer, and the capacitor top metal, wherein the capacitor bottom metal and the inter-electrode dielectric layer cover the same area;

depositing a first dielectric layer to cover the first capacitor;

forming at least one first via and at least one eighth via penetrating the first dielectric layer, wherein the first via is electrically connected to the capacitor top metal of the first capacitor and the eighth via is electrically connected to the capacitor bottom metal of the first capacitor;

forming a second film lamination including a capacitor bottom metal film, an inter-electrode dielectric film, and a capacitor top metal film on the first dielectric layer;

patterning the capacitor top metal film of the second film lamination to form capacitor top metals of a second capacitor, a third capacitor and a fourth capacitor;

after patterning the capacitor top metal film, patterning the capacitor bottom metal film and the inter-electrode dielectric film of the second film lamination to form capacitor bottom metals of the second capacitor, the third capacitor and the fourth capacitor, and a thin film resistor, wherein the capacitor bottom metal of the fourth capacitor is in contact with the first dielectric layer;

depositing a second dielectric layer to cover the first dielectric layer, the second capacitor, and the thin film resistor;

forming at least one sixth via penetrating the second dielectric layer, wherein the sixth via is electrically connected to the capacitor top metal of the fourth capacitor;

forming at least one seventh via penetrating the second dielectric layer, wherein the seventh via is electrically connected to the capacitor bottom metal of the fourth capacitor; and forming a plurality of second vias and at least one ninth via penetrating the second dielectric layer, wherein the plurality of second vias is electrically connected to the capacitor top metal of the second capacitor and the thin film resistor respectively, and the ninth via is electrically connected to the capacitor bottom metal of the first capacitor.

2. The method of fabricating the integrated circuit of claim 1, before the step of forming the second film lamination, further comprising:
forming at least one first interlayer metal pad electrically connected to the first via, wherein the first interlayer metal pad is electrically connected to the capacitor bottom metal of the second capacitor.

3. The method of fabricating the integrated circuit of claim 2, before the step of forming the second film lamination, further comprising:
forming at least one second interlayer metal pad electrically connected to the capacitor bottom metal of the third capacitor.

4. The method of fabricating the integrated circuit of claim 3, further comprising:
forming at least one fourth via penetrating the second dielectric layer, wherein the fourth via is electrically connected to the capacitor top metal of the third capacitor; and
forming at least one fifth via penetrating the second dielectric layer, wherein the fifth via is electrically connected to the capacitor bottom metal of the third capacitor.

5. The method of fabricating the integrated circuit of claim 3, wherein the first interlayer metal pad, the second interlayer metal pad, and the first via are made of copper.

6. The method of fabricating the integrated circuit of claim 3, wherein the capacitor bottom metal, the capacitor top metal, and the inter-electrode dielectric layer of the third capacitor are respectively at the same layers as those of the second capacitor.

7. The method of fabricating the integrated circuit of claim 1, further comprising:
forming a plurality of bonding pads disposed on the second dielectric layer,
wherein at least one of the plurality of bonding pads is electrically connected to the capacitor bottom metal of the first capacitor, at least one of the plurality of bonding pads is electrically connected to the capacitor top metal of the second capacitor, and at least two of the plurality of bonding pads are electrically connected to the thin film resistor.

8. The method of fabricating the integrated circuit of claim 7, wherein each of the bonding pads is a bonding wire, a metal clip or a bump.

9. The method of fabricating the integrated circuit of claim 1, wherein patterning the first film lamination further comprises:
forming a photo resist mask on the first film lamination; and
etching the first film lamination.

10. The method of fabricating the integrated circuit of claim 1, wherein the capacitor bottom metal of the second capacitor and the thin film resistor are substantially at the same layer.

11. The method of fabricating the integrated circuit of claim 1, wherein the material of the capacitor bottom metal of the second capacitor is substantially the same as the material of the thin film resistor.

12. The method of fabricating the integrated circuit of claim 1, wherein an area of the capacitor bottom metal of the first capacitor is larger than that of the capacitor top metal of the first capacitor.

13. The method of fabricating the integrated circuit of claim 1, wherein the capacitor bottom metal of the first capacitor is a film lamination consisting of two titanium nitride (TiN) films and an aluminum-copper alloy (AlCu) film which is sandwiched by the two TiN films.

14. The method of fabricating the integrated circuit of claim 1, wherein the capacitor top metals of the first capacitor and the second capacitor are made of tantalum nitride (TaN), titanium nitride (TiN), aluminium-copper alloy (AlCu), or a combination thereof.

15. The method of fabricating the integrated circuit of claim 1, wherein the inter-electrode dielectric layer of the first capacitor is sandwiched by the capacitor bottom metal and the capacitor top metal of the first capacitor.

16. The method of fabricating the integrated circuit of claim 1, wherein the inter-electrode dielectric film of the second film lamination is sandwiched by the capacitor bottom metal film and the capacitor top metal film of the second film lamination.

17. A method of fabricating an integrated circuit, comprising:
forming a first capacitor on a semiconductor substrate;
depositing a first dielectric layer to cover the first capacitor;
forming a capacitor bottom metal film on the first dielectric layer, an inter-electrode dielectric film on the capacitor bottom metal film, and a capacitor top metal film on the inter-electrode dielectric film;
patterning the capacitor top metal film;
patterning the inter-electrode dielectric film and the capacitor bottom metal film,
wherein patterning the capacitor bottom metal film is performed after patterning the capacitor top metal film, and the patterned capacitor bottom metal film forms a capacitor bottom metal of a second capacitor, a capacitor bottom metal of a third capacitor, and a thin film resistor on the dielectric layer;
depositing a second dielectric layer to cover the first dielectric layer, the second and third capacitors, and the thin film resistor;
forming a ninth via penetrating the second dielectric layer and electrically connected to the capacitor bottom metal of the first capacitor;
forming an interlayer metal pad connected between the first capacitor and the capacitor bottom metal of the second capacitor; and
forming a second via electrically connected to the thin film resistor.

18. The method of fabricating the integrated circuit of claim 17, wherein the patterned capacitor bottom metal film further forms a capacitor bottom metal of a fourth capacitor.

19. A method of fabricating an integrated circuit, comprising:
forming a first capacitor on a semiconductor substrate;
depositing a first dielectric layer to cover the first capacitor;
forming a capacitor bottom metal film on the first dielectric layer, an inter-electrode dielectric film on the capacitor bottom metal film, and a capacitor top metal film on the inter-electrode dielectric film;
patterning the capacitor top metal film;
patterning the inter-electrode dielectric film and the capacitor bottom metal film to form an interlayer connection, wherein patterning the capacitor bottom metal film is performed after patterning the capacitor top metal film, and the patterned capacitor bottom metal film forms a capacitor bottom metal of a second capacitor on a first location, a capacitor bottom metal of a third capacitor, and a thin film resistor on the dielectric layer, the first location corresponding to where no interlayer metal pad in the dielectric layer is connected to the capacitor bottom metal of the second capacitor;

depositing a second dielectric layer to cover the first dielectric layer, the second and third capacitors, and the thin film resistor;

forming a ninth via penetrating the second dielectric layer and electrically connected to the capacitor bottom metal of the first capacitor through the interlayer connection;

forming a first via connected to the first capacitor; and forming a second via electrically connected to the thin film resistor.

20. The method of fabricating the integrated circuit of claim 18, wherein the patterned capacitor top metal film forms a capacitor top metal of the second capacitor, a capacitor top metal of the third capacitor, and a capacitor top metal of the fourth capacitor.

\* \* \* \* \*